US011249503B2

(12) United States Patent
Sakamoto et al.

(10) Patent No.: US 11,249,503 B2
(45) Date of Patent: Feb. 15, 2022

(54) CURRENT SOURCE WITH NONVOLATILE STORAGE ELEMENT

(71) Applicant: ASAHI KASEI MICRODEVICES CORPORATION, Tokyo (JP)

(72) Inventors: Toshiro Sakamoto, Tokyo (JP); Yuukou Tsushima, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/342,997

(22) PCT Filed: Oct. 3, 2017

(86) PCT No.: PCT/JP2017/036025
§ 371 (c)(1),
(2) Date: Apr. 18, 2019

(87) PCT Pub. No.: WO2018/074225
PCT Pub. Date: Apr. 26, 2018

(65) Prior Publication Data
US 2019/0243405 A1    Aug. 8, 2019

(30) Foreign Application Priority Data
Oct. 19, 2016 (JP) .............................. JP2016-205209

(51) Int. Cl.
*G05F 3/24* (2006.01)
*G11C 16/30* (2006.01)
(Continued)

(52) U.S. Cl.
CPC ................ *G05F 3/245* (2013.01); *G05F 3/24* (2013.01); *G11C 16/02* (2013.01); *G11C 16/04* (2013.01);
(Continued)

(58) Field of Classification Search
CPC ........... G05F 3/24; G05F 3/245; G11C 16/10; G11C 16/04; G11C 16/02; G11C 16/0416;
(Continued)

(56) References Cited

U.S. PATENT DOCUMENTS 5,753,953 A    5/1998 Fukumoto
5,930,171 A *  7/1999 Zettler .................. G11C 16/30
                                                          257/E27.103
(Continued)

FOREIGN PATENT DOCUMENTS

EP    0763856 A1    3/1997
JP    2002-006968 A 1/2002
(Continued)

OTHER PUBLICATIONS

International Preliminary Report on Patentability dated Apr. 23, 2019, for the corresponding International Application No. PCT/JP2017/036025.
(Continued)

*Primary Examiner* — Thienvu V Tran
*Assistant Examiner* — Shahzeb K Ahmad
(74) *Attorney, Agent, or Firm* — Morgan, Lewis & Bockius LLP

(57) ABSTRACT

The object of the present invention is to provide a current source which is capable of suppressing an increase in circuit size and by which a highly accurate constant current extremely stable to manufacturing variations or temperature fluctuations can be obtained. A current source circuit is provided with a nonvolatile storage element having a control gate region and a source region and operating as a field-effect transistor, and is configured to output a current in a state where a bias is applied between the control gate region and the source region.

14 Claims, 13 Drawing Sheets

(51) Int. Cl.
*H01L 29/792* (2006.01)
*H01L 29/788* (2006.01)
*H01L 27/11521* (2017.01)
*G11C 16/04* (2006.01)
*G11C 16/02* (2006.01)
*H01L 27/115* (2017.01)
*G11C 16/10* (2006.01)
*H01L 27/10* (2006.01)

(52) U.S. Cl.
CPC .......... *G11C 16/0416* (2013.01); *G11C 16/10* (2013.01); *G11C 16/30* (2013.01); *H01L 27/10* (2013.01); *H01L 27/115* (2013.01); *H01L 27/11521* (2013.01); *H01L 29/788* (2013.01); *H01L 29/792* (2013.01)

(58) Field of Classification Search
CPC ....... G11C 16/30; H01L 27/10; H01L 27/115; H01L 27/11521; H01L 29/788; H01L 29/792
See application file for complete search history.

(56) References Cited

U.S. PATENT DOCUMENTS

| | | | |
|---|---|---|---|
| 9,864,392 B2* | 1/2018 | Georgiou | G05F 3/24 |
| 2002/0036488 A1 | 3/2002 | Ueda | |
| 2003/0146785 A1 | 8/2003 | Ueda | |
| 2003/0206440 A1* | 11/2003 | Wong | H01L 29/7887 365/185.11 |
| 2006/0133171 A1* | 6/2006 | Tonda | G11C 7/062 365/185.01 |
| 2009/0146731 A1* | 6/2009 | Yoshida | H01L 27/0883 327/543 |
| 2015/0008496 A1* | 1/2015 | Chakrabartty | H01L 28/40 257/298 |
| 2017/0162588 A1* | 6/2017 | Harada | H01L 27/11521 |

FOREIGN PATENT DOCUMENTS

| | | | |
|---|---|---|---|
| JP | 2002-368107 A | | 12/2002 |
| JP | 4473627 B2 | | 3/2010 |
| JP | 2014-071515 A | | 4/2014 |
| JP | 2015-011454 A | | 1/2015 |
| JP | 2015011454 A | * | 1/2015 |

OTHER PUBLICATIONS

Bendali et al., "A 1-V CMOS Current Reference With Temperature and Process Compensation", IEEE Transactions on Circuits and Systems—I: Regular Papers, vol. 54, No. 7, pp. 1424-1429, Jul. 9, 2007.
International Search Report dated Dec. 19, 2017, issued in corresponding International Patent Application No. PCT/JP2017/036025.
Supplementary European Search Report dated Oct. 21, 2019, issued in the corresponding European Patent Application No. 17861693.4.

* cited by examiner

SAMPLE A : Vth = 0.33 V at 25°C
SAMPLE B : Vth = 0.63 V at 25°C

CURRENT SOURCE WITH NONVOLATILE STORAGE ELEMENT

TECHNICAL FIELD

The present invention relates to a current source provided with a nonvolatile storage element.

BACKGROUND ART

FIG. 21 is a circuit diagram illustrating the configuration of a conventional constant current source generation circuit 100 using a field effect transistor (MOSFET). The constant current source generation circuit 100 is provided with a current source 101 operating in a saturated region by short-circuiting a gate and a source of a depression MOSFET 101a. The constant current source generation circuit 100 is provided with a so-called current mirror circuit 102 in which gates and sources of two enhancement MOSFETs 102a and 102b having the same electric characteristics are short-circuited. The constant current source generation circuit 100 multiplies a reference current Iref flowing into the current source 101 by a constant (n) in the current mirror circuit 102 to generate a constant current Icc which is an output current. In the case of the constant current source generation circuit 100, a current value of the constant current Icc is a square-law characteristic of the reference current Iref flowing into the depression MOSFET 101a provided in the current source 101 as expressed by the following expression (1).

[Expression 1]

$$I_{cc} = n \times Iref \\
= n \times Kd \times \left(\frac{Wd}{Ld}\right) \times |Vtnd|^2 \quad (1)$$

In Expression (1), Vtnd, Kd, Wd, and Ld indicate a threshold voltage, an electrical conduction coefficient, an effective value of a channel width, and an effective value of a channel length, respectively, of the depression MOSFET 101a.

In general, variations in a wafer manufacturing process are large, and therefore variations in the threshold voltage Vtnd of the depression MOSFET are large, and thus variations in a current value of the constant current Icc and the temperature characteristic $\partial Icc/\partial T$ of the constant current Icc expressed by the following expression (2) are also large.

[Expression 2]

$$\left(\frac{\partial I_{cc}}{\partial T}\right) = \frac{\partial \left\{Ke \times \left(\frac{We}{Le}\right) \times |Vtnd|^2\right\}}{\partial T} \quad (2) \\
= \left(\frac{We}{Le}\right) \times \\
\left[\left\{|Vtnd|^2 \times \left(\frac{\partial Ke}{\partial T}\right)\right\} + \left\{|Vtnd| \times Ke \times \left(\frac{\partial |Vtnd|}{\partial T}\right)\right\}\right]$$

PTL 1 discloses a constant current source with reduced variations in a manufacturing process and temperature dependency. As illustrated in FIG. 22, a constant current source 300 disclosed in PTL 1 is provided with a current setting code generation circuit 301 correcting a current value of an output current generated by a constant current circuit 302 even when the temperature dependency and the variations of the current value in the manufacturing process are large. Thus, the constant current circuit 302 makes it possible to obtain a highly accurate current value.

CITATION LIST

Patent Literature

PTL 1: Japanese Patent No. 4473627

SUMMARY OF INVENTION

Technical Problem

A conventional constant current source is disadvantageous in that the conventional constant current source needs to be provided with a correction circuit correcting a current value fluctuating to manufacturing variations or temperatures in order to obtain a highly accurate fixed current and the size of the correction circuit increases according to demanded accuracy, and thus a consumption current increases or a chip area increases.

It is an object of the present invention to provide a current source which is capable of suppressing an increase in the circuit size and by which a highly accurate constant current extremely stable to manufacturing variations or temperature fluctuations can be obtained.

Solution to Problem

In order to achieve the above-described object, a current source according to one aspect of the present invention is provided with a nonvolatile storage element having a control gate region and a source region and operating as a field effect transistor, and is configured to output a current in a state where a bias is applied between the control gate region and the source region.

Advantageous Effects of Invention

According to one aspect of the present invention, an increase in the circuit size can be suppressed and an output current extremely stable to manufacturing variations or temperature changes can be obtained.

DESCRIPTION OF EMBODIMENTS

Embodiments of the present invention will now be described with reference to the drawings. Hereinafter, a description is given using an N-type field effect transistor provided with a floating gate region and a control gate region as a nonvolatile storage element used as a constant current source. However, the nonvolatile storage element is not limited to the structure and not limited to the N-type insofar as the nonvolatile storage element is a transistor having a charge accumulation region.

The present inventors have found that, in realizing a highly accurate current source using the nonvolatile storage element, the change rate to temperatures is important to the current characteristics of the nonvolatile storage element acting as a field effect transistor and have found the temperature characteristics described later illustrated in FIG. 9.

First Embodiment

Figure 1:
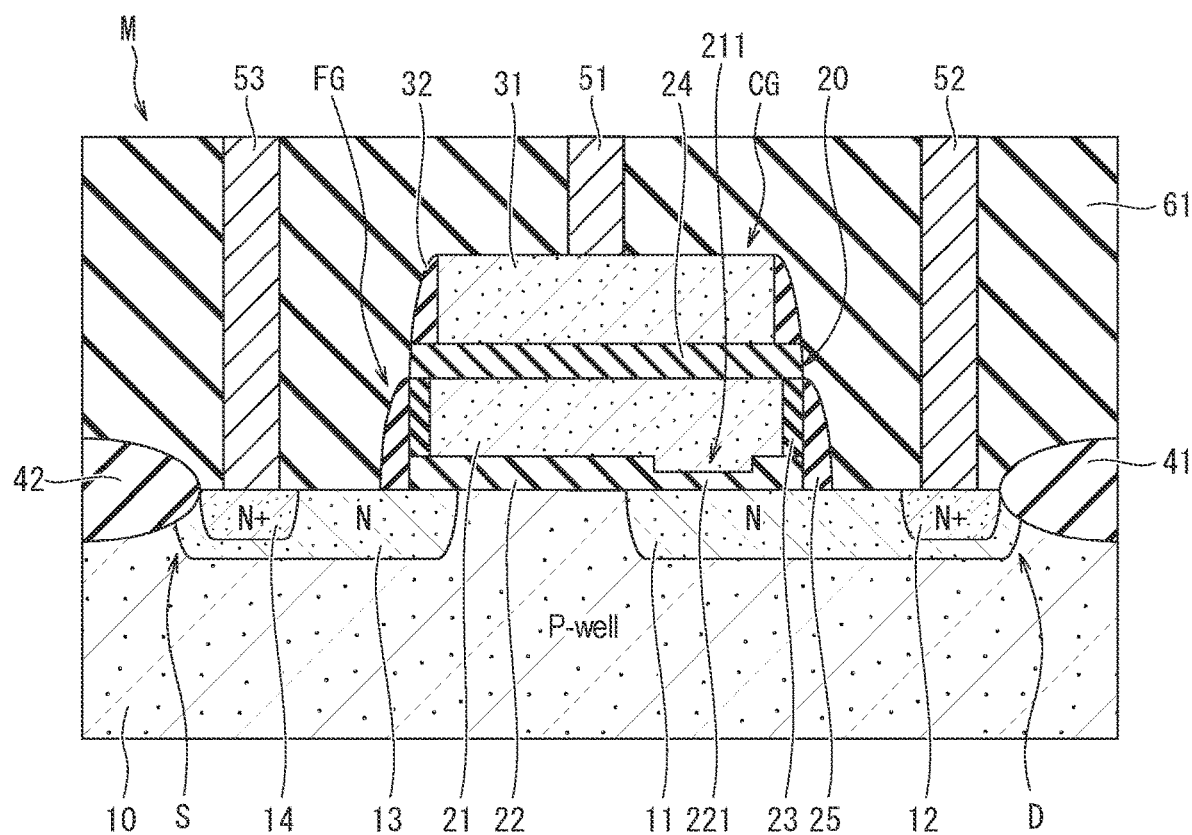
FIG. 1 is a cross-sectional view illustrating the schematic configuration of a nonvolatile storage element M provided in a current source according to a first embodiment of the present invention.

As illustrated in FIG. 1, a nonvolatile storage element M provided in a current source according to this embodiment is provided with a P-well region 10 formed in a semiconductor substrate, a floating gate region FG formed on the P-well region 10, and a control gate region CG formed on the floating gate region FG. Moreover, the nonvolatile storage element M is provided with a drain region D formed in one of both sides under the floating gate region FG and a source region S formed in the other one of both the sides under the floating gate region FG. The drain region D and the source region S are formed in the P-well region 10. The nonvolatile storage element M is element-isolated from the other elements formed on the same semiconductor substrate by element isolation regions 41 and 42.

The floating gate region FG contains a charge holding region 21 and an insulator 20. More specifically, the nonvolatile storage element M is provided with the charge holding region 21 and the insulator 20 disposed surrounding the charge holding region 21. The insulator 20 contains a gate insulating film 22 formed under the charge holding region 21, a lateral wall oxide film 23 formed by oxidizing the lateral wall of the charge holding region 21, and an upper insulating film 24 formed on the charge holding region 21. Around the gate insulating film 22 and the lateral wall oxide film 23, a sidewall 25 is formed.

In the gate insulating film 22, a tunnel insulating film 221 is formed. The tunnel insulating film 221 is a portion formed to have relatively thin film thickness in the gate insulating film 22. A region where the tunnel insulating film 221 is formed serves as a charge injection port 211 injecting charges into the charge holding region 21 or emitting charges from the charge holding region 21. More specifically, the charge holding region 21 has the charge injection port 211 for injecting charges or emitting charges.

The control gate region CG has a polysilicon film 31 formed on the upper insulating film 24. Around the polysilicon film 31, a sidewall 32 formed on the upper insulating film 24 is formed.

The drain region D has an N-type region 11 and an N-type N+ region 12 having an impurity concentration higher than that of the N-type region 11. The N+ region 12 is provided in order to achieve an ohmic contact between the drain region D and a contact plug 52 described later.

The source region S has an N-type region 13 and an N-type N+ region 14 having an impurity concentration higher than that of the N-type region 13. The N+ region 14 is provided in order to achieve an ohmic contact between the source region S and a contact plug 53 described later. The drain region D and the source region S are defined by a current flowing direction. Therefore, when a current flowing direction of an assumed current is reversed in the nonvolatile storage element M illustrated in FIG. 1, the drain region D illustrated in FIG. 1 serves as the source region S and the source region S serves as the drain region D.

The nonvolatile storage element M is provided with a protective film 61 formed on the control gate region CG, the floating gate region FG, the drain region D, and the source region S. In the protective film 61, an opening portion partially exposing the polysilicon film 31 of the control gate region CG as the bottom surface is formed. In the opening portion, a contact plug 51 is embedded and formed. Thus, the contact plug 51 and the polysilicon film 31 of the control gate region CG are electrically connected.

In the protective film 61, an opening portion partially exposing the N+ region 12 of the drain region D as the bottom surface is formed. In the opening portion, a contact plug 52 is embedded. Thus, the contact plug 52 and the N+ region 12 are electrically connected. Moreover, in the protective film 61, an opening portion partially exposing the N+ region 14 of the source region S as the bottom surface is formed. In this opening portion, a contact plug 53 is embedded. Thus, the contact plug 53 and the N+ region 14 are electrically connected.

Although not illustrated, wiring formed on the protective film 61 is connected to each of the contact plugs 51, 52, and 53. The control gate region CG, the drain region D, and the source region S are connected to the wiring by the contact plugs 51, 52, and 53 and a voltage of a predetermined level is applied from the wiring.

Figure 2A:
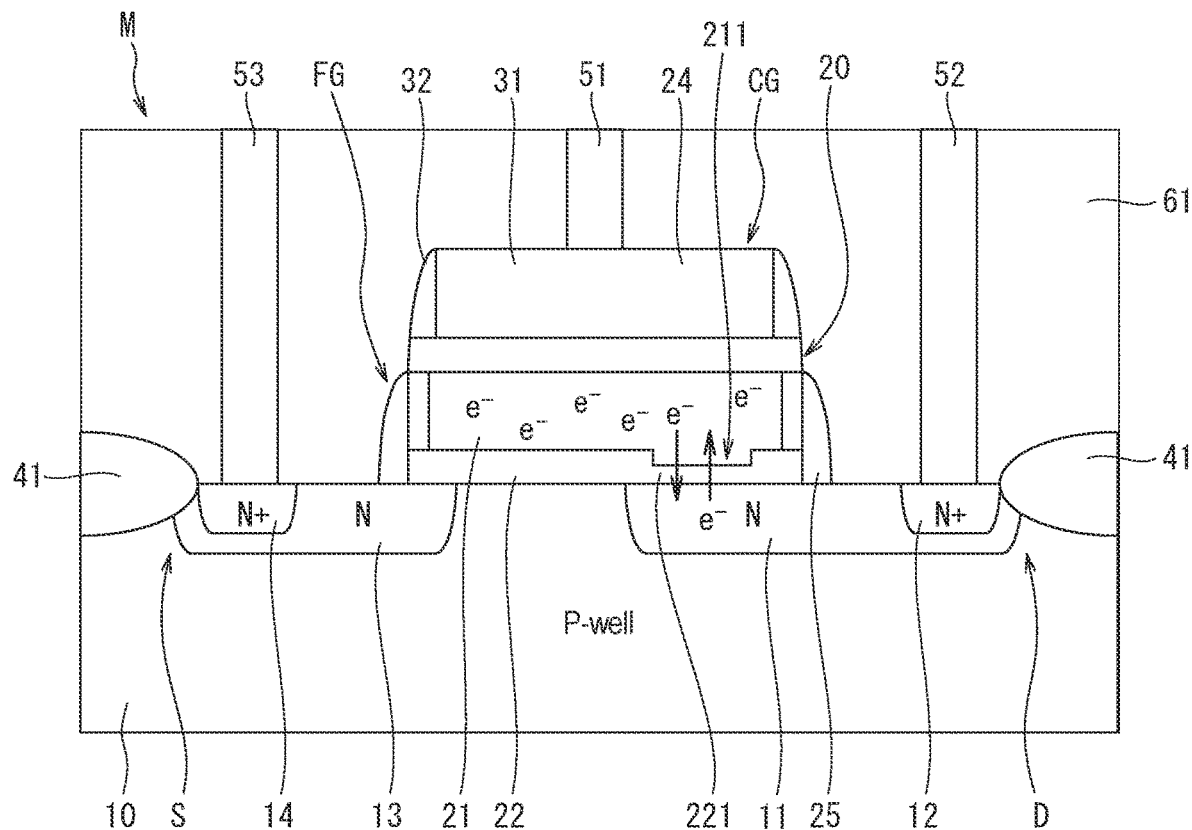
FIGS. 2A to 2C are views for explaining the state of charge injection and charge emission of the nonvolatile storage element M provided in the current source according to the first embodiment of the present invention.
Figure 2B:
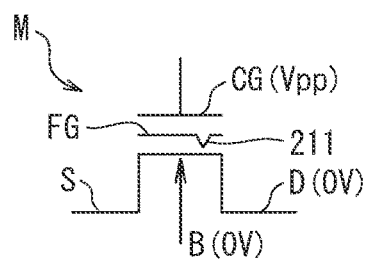
Figure 2C:
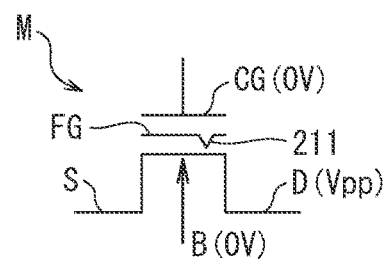

A threshold voltage Vth of the nonvolatile storage element M is controlled by the amount of charges injected into the floating gate region FG. As illustrated in FIG. 2A, an electron as the charge is injected into the floating gate region FG of the nonvolatile storage element M through the charge injection port 211. In FIG. 2A, in order to facilitate the understanding, the illustration of hatching is omitted to the cross section of each constituent component of the nonvolatile storage element M. As illustrated in FIG. 2B, when electrons are injected into the floating gate region FG, the P-well region 10 (i.e., back gate B) and the drain region D are fixed to 0 V, for example, and then a pulse voltage Vpp of 10 V or more is applied to the control gate region CG. Thus, the electrons are injected into the charge holding region 21 through the charge injection port 211 from the drain region D as indicated by the upward straight arrow in FIG. 2A. On the other hand, as illustrated in FIG. 2C, in emitting electrons from the floating gate region FG, the control gate region CG and the P-well region 10 (i.e., back gate B) are fixed to 0 V, for example, and then the pulse voltage Vpp of 10 V or more is applied to the drain region D. Thus, electrons are emitted to the drain region D through the charge injection port 211 from the charge holding region 21 as indicated by the downward straight arrow in FIG. 2A. Thus, the nonvolatile storage element M can inject/emit charges through the charge injection port 211 by controlling a voltage applied to the control gate region CG, the P-well region 10, and the drain region D. The nonvolatile storage element M does not use the source region S for injecting and emitting charges, and therefore the source region S may be fixed to a predetermined voltage (for example, 0 V) or may be set to a floating state.

Next, the electric characteristics of a super-highly accurate constant current source using the nonvolatile storage element M are described with reference to FIG. 3 to FIG. 11. The horizontal axis of the graph illustrated in FIG. 3 indicates the drain-source voltage Vds of the field effect transistor and the vertical axis thereof indicates a drain-source current Ids of the field effect transistor. The horizontal axis of the graph illustrated in each of FIG. 4 to FIG. 6 indicates the gate-source voltage Vgs of the field effect transistor and the vertical axis thereof indicates the drain-source current Ids of the field effect transistor.

Figure 3:
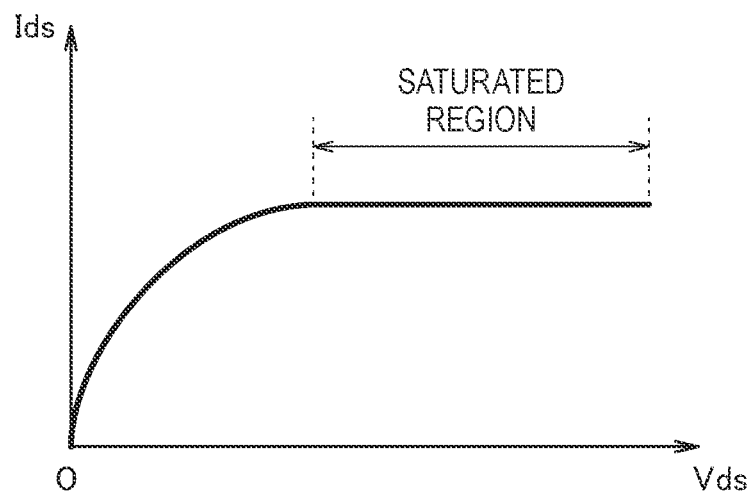
FIG. 3 is a view explaining the nonvolatile storage element M provided in the current source according to the first embodiment of the present invention and is a conceptual diagram illustrating the characteristic of a drain-source current Ids to a drain-source voltage Vds of a field effect transistor.
Figure 4:
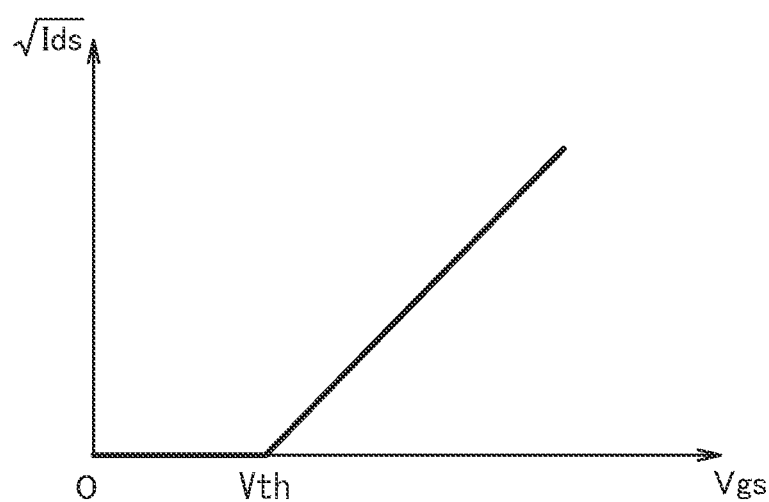
FIG. 4 is a view explaining the nonvolatile storage element M provided in the current source according to the first embodiment of the present invention and is a conceptual diagram illustrating the characteristic of the drain-source current Ids to a gate-source voltage Vgs of the field effect transistor.
Figure 5:
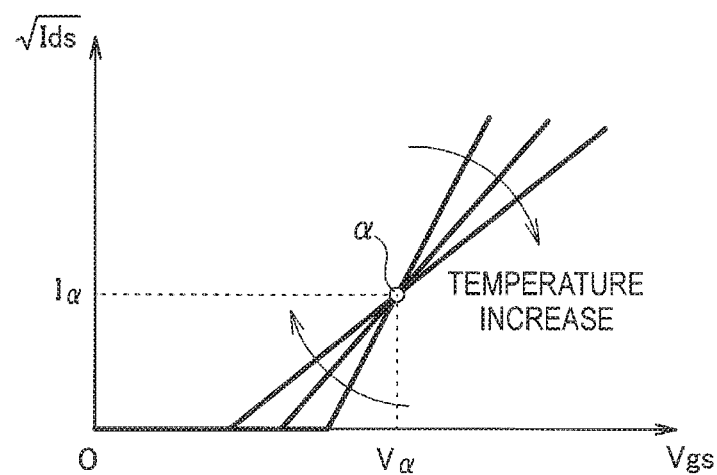
FIG. 5 is a view explaining the nonvolatile storage element M provided in the current source according to the first embodiment of the present invention and is a conceptual diagram illustrating temperature dependency of the drain-source current Ids of the field effect transistor.

Since the nonvolatile storage element M is a field effect transistor, the drain-source current Ids flowing into the nonvolatile storage element M exhibits a "constant current characteristic" not dependent on the drain voltage (i.e., drain-source voltage Vds) in a region having a high drain voltage referred to as a saturated region as illustrated in the conceptual diagram of FIG. 3. On the other hand, with respect to the drain-source current Ids flowing into the nonvolatile storage element M, when the gate voltage (i.e., gate-source voltage Vgs) is increased to be larger than the threshold voltage Vth, the current amount of the drain-source current Ids flowing into the nonvolatile storage element M increases in proportion to the square of the voltage value of the gate voltage (FIG. 4 illustrates that √Ids is proportional to Vgs) even in the saturated region as illustrated in the conceptual diagram of FIG. 4. More specifically, the current amount of the drain-source current Ids flowing into the nonvolatile storage element M is dependent only on the gate voltage and varies depending on the magnitude of the gate-source voltage Vgs to the threshold voltage Vth (i.e., Vgs−Vth) in the saturated region. The drain-source current Ids in the saturated region can be expressed by the following expression (3).

[Expression 3]

$$I_{ds} \approx \frac{1}{2} \times \frac{W\mu C_{ox}}{L}(V_{gs} - V_{th})^2 \qquad (3)$$

In Expression (3), W indicates the gate width, L indicates the gate length, μ indicates the carrier mobility, and Cox indicates the gate insulating film capacity.

Even when transistors are manufactured under the same conditions, variations in manufacturing occur in the electrical properties and the like. In usual, transistors are produced with variations of about ±0.1 V in the threshold voltage. Therefore, even when a fixed gate voltage is applied to the transistors manufactured under the same conditions from the outside, the threshold voltage varies in each transistor, and therefore a drain current flowing into each transistor varies. Therefore, a constant current source merely using the current saturation characteristics of a field effect transistor is difficult to sufficiently increase the accuracy. However, the current source according to this embodiment is provided with the nonvolatile storage element M operating as a field effect transistor. Therefore, the current source according to this embodiment enables the trimming of the threshold voltage by the amount of charges injected into the floating gate region FG after manufacturing. Therefore, in the current source according to this embodiment, variations in the current amount of the drain current due to the variations in the threshold voltage hardly occur.

Next, the temperature characteristics of the drain current of the field effect transistor are described. The threshold voltage Vth and the carrier mobility μ of the field effect transistor expressed by Expression (3) can be expressed by the following expression (4) and expression (5) as a function of a temperature T.

[Expression 4]

$$\mu(T) = \mu(T_r)\left(\frac{T}{T_r}\right)^{-\alpha} \quad (4)$$

[Expression 5]

$$V_{th}(T) = V_{th}(T_r) - \beta(T - T_r) \quad (5)$$

In Expression (4) and Expression (5), Tr indicates room temperature, α generally indicates a dimensionless constant of 1.2 to 2.0, and β generally indicates a constant of 0.5 to 3 [mV/K].

More specifically, both the threshold voltage and the carrier mobility of the field effect transistor decrease with an increase in the temperature. Due to the fact that the threshold voltage and the carrier mobility of the field effect transistor have such temperature dependency, the drain current of the field effect transistor exhibits the temperature dependency as illustrated in the conceptual diagram of FIG. 5. Herein, due to the fact that both the threshold voltage and the carrier mobility of the field effect transistor change in the same direction to temperatures, a gate voltage value Vα of the gate-source voltage Vgs in which the drain current of the field effect transistor is not dependent on temperatures is present. More specifically, the temperature dependency does not occur in a drain current value Iα of the drain-source current Ids created by the gate voltage value Vα of the gate-source voltage Vgs not exhibiting the temperature dependency. Hereinafter, the gate-source voltage Vgs and the drain-source current Ids where the field effect transistor operates without exhibiting the temperature dependency are defined as the operation point α.

Furthermore, even when the threshold voltage between field effect transistor samples varies due to manufacturing variations, the gate voltage value Vα at the operation point α is hardly affected by the manufacturing variations when read as a relative gate voltage value Von on the basis of the threshold voltage. Moreover, the drain current value Iα at the operation point α is also hardly affected by the manufacturing variations.

Figure 6:
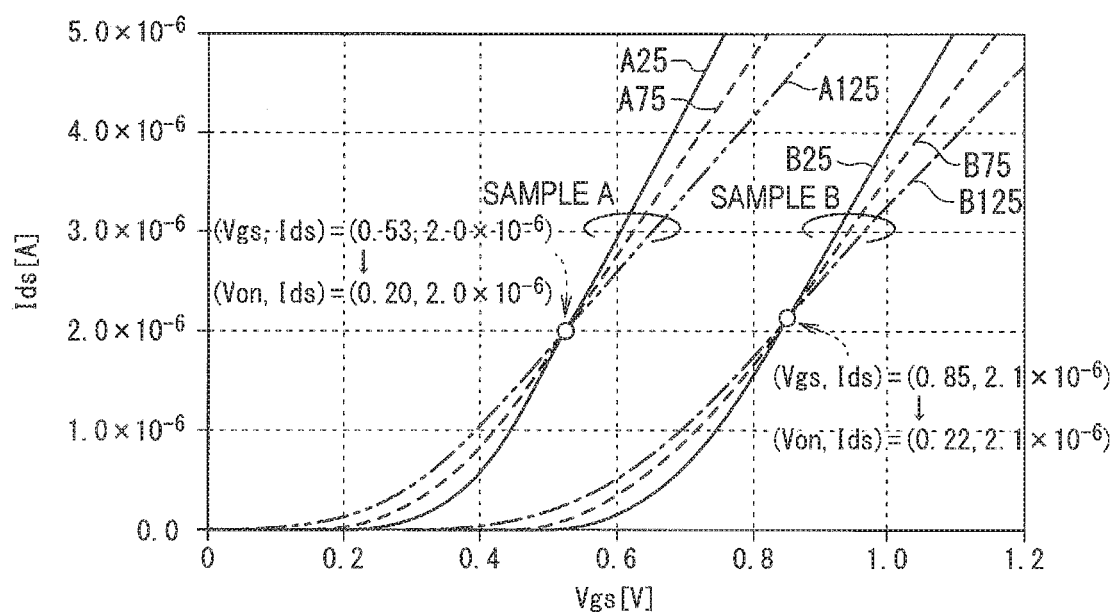
FIG. 6 is a view explaining the nonvolatile storage element M provided in the current source according to the first embodiment of the present invention and is a view illustrating a result of confirming a gate voltage value Von and a drain current value Iα at an operation point α of the field effect transistor.

As reference, FIG. 6 illustrates a result of confirming the gate voltage value Von and the drain current value Iα at the operation point α by the N-type field effect transistor in which the threshold voltage is intentionally sharply varied by varying the substrate concentration. Among samples A illustrated in FIG. 6, a characteristic A25 indicates the characteristic at 25° C., a characteristic A75 indicates the characteristic at 75° C., and a characteristic A125 indicates the characteristic at 125° C. Among samples B illustrated in FIG. 6, a characteristic B25 indicates the characteristic at 25° C., a characteristic B75 indicates the characteristic at 75° C., and a characteristic B125 indicates the characteristic at 125° C.

As illustrated in FIG. 6, the gate voltage value Von at the operation point α of the samples A is 0.2 (=0.53-0.33) V and the drain current value Iα is 2.0 μA. On the other hand, the gate voltage value Von at the operation point α of the samples B in which the threshold voltage is higher than that of the samples A by 0.3 V is 0.22 (=0.85-0.63) V and the drain current value Iα is 2.1 μA. Thus, even in the case of the samples A and the samples B in which the threshold voltage is daringly fluctuated by 0.3 V, a difference ΔVon between the gate voltage values Von realizing the operation point α is 0.02 V and a difference ΔIα between the drain current values Iα is 0.1 μA. More specifically, even when the threshold voltage is shifted by 0.3 V, the gate voltage value Von at the operation point α of the N-type field effect transistor varies by only 10% and the drain current value Iα varies by only 5%. Since realistic threshold value variations in manufacturing of the field effect transistor are about ±0.1 V, the gate voltage value Von of the gate-source voltage Vds and the drain current value Iα of the drain-source current Ids are hardly affected by manufacturing variations. Therefore, when a threshold voltage fluctuated by manufacturing variations is trimmed to a proper value, the current source supplying the drain-source current Ids at the operation point α not only does not have the temperature characteristics but hardly causes current amount variations due to manufacturing variations. Although the graph illustrated in FIG. 6 illustrates the characteristics of a linear region where the drain voltage is low in such a manner that the threshold voltage is legible, the similar result is obtained even in the saturated region.

Therefore, the threshold voltage fluctuations which is main cause of drain current variations is trimmed by injection of charges into the floating gate region FG, and further the threshold voltage adjusted by trimming is adjusted to a voltage value driving a current amount of a current required by a circuit (load driven by a current source) on the gate-source voltage Vgs at the operation point α free from the temperature characteristics. The nonvolatile storage element M thus adjusted realizes a super-highly accurate constant current characteristic having almost no manufacturing variations and temperature characteristics. Specifically, for example, when operated as a constant current source of an analog circuit by injecting charges into the floating gate region FG after manufacturing of the nonvolatile storage element M in such a manner that the gate voltage value Vα at the operation point α is 0 V, a super-highly accurate constant current source can be realized by a very simple circuit by short-circuiting the control gate region CG and the source region S. It is necessary to perform the adjustment of the drain-source current Ids in terms of the size of a transistor and acquire in advance the gate voltage value Von and the drain current value Iα realizing the operation point α of the nonvolatile storage element M as parameters.

Figure 7:
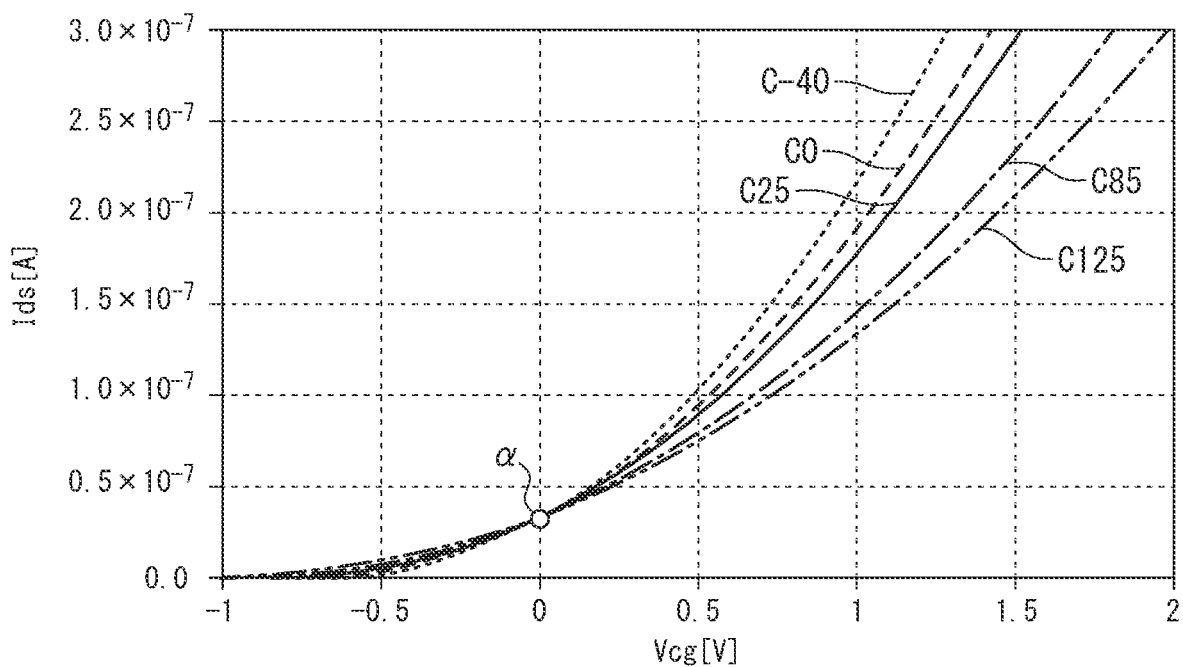
FIG. 7 is a view explaining the nonvolatile storage element M provided in the current source according to the first embodiment of the present invention and is a view illustrating the current characteristic of the drain current characteristic to a control gate voltage Vcg applied to a control gate region CG of the nonvolatile storage element M and a temperature.

In FIG. 6, the operation point α where the drain current is not dependent on temperatures is merely one point. However, even when the nonvolatile storage element M is used at the gate-source voltage Vgs around the operation point α, a sufficiently super-highly accurate constant current source is obtained. The gate-source voltage in the nonvolatile storage element M is equivalent to a voltage (hereinafter also sometimes referred to as "control gate voltage") between the control gate region CG and the source region S. FIG. 7 illustrates the drain current characteristics to the control gate voltage Vcg applied to the control gate region CG of the nonvolatile storage element M illustrated in FIG. 1 and temperatures. The horizontal axis indicates the control gate voltage Vcg and the vertical axis indicates the drain-source current Ids. A characteristic C-40 indicates the drain current characteristic at −40° C., a characteristic C0 indicates the drain current characteristic at 0° C., a characteristic C25 indicates the drain current characteristic at 25° C., a characteristic C85 indicates the drain current characteristic at 85° C., and a characteristic C125 indicates the drain current characteristic at 125° C. The drain current characteristics illustrated in FIG. 7 are the characteristics in a saturated region where the drain voltage Vds is sufficiently large.

Figure 8:
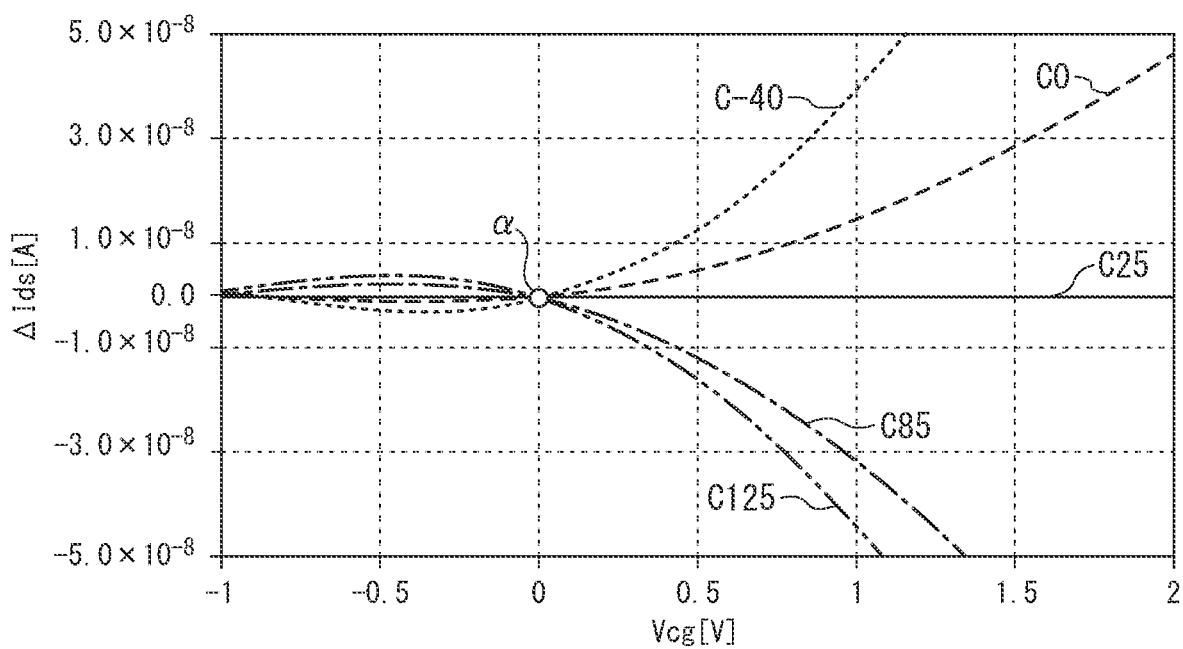
FIG. 8 is a view explaining the nonvolatile storage element M provided in the current source according to the first embodiment of the present invention and is a view illustrating the drain current characteristic of the nonvolatile storage element M of each temperature by the change amount from the drain current amount at 25° C.

FIG. 8 illustrates the drain current characteristic of each temperature illustrated in FIG. 7 by the change amount from the drain current amount at 25° C. The horizontal axis indicates the control gate voltage Vcg and the vertical axis indicates the drain current change amount ΔIds. A characteristic C-40 indicates the characteristic of the drain current change amount at −40° C., a characteristic C0 indicates the characteristic of the drain current change amount at 0° C., a characteristic C25 indicates the characteristic of the drain current change amount at 25° C., a characteristic C85 indicates the characteristic of the drain current change amount at 85° C., and a characteristic C125 indicates the characteristic of the drain current change amount at 125° C.

Figure 9:
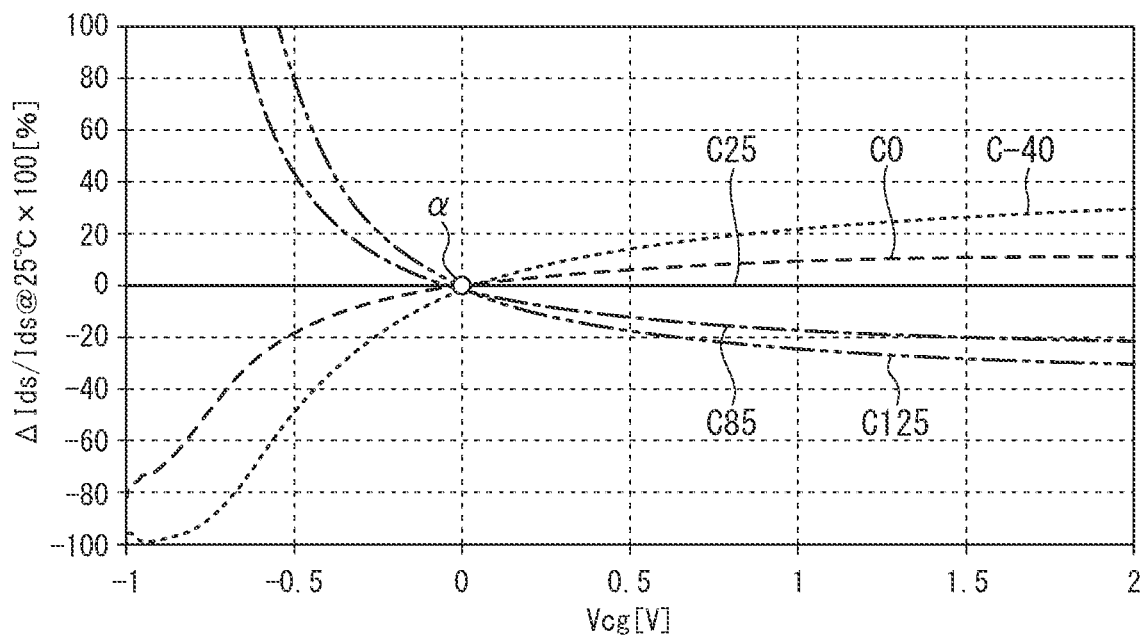
FIG. 9 is a view explaining the nonvolatile storage element M provided in the current source according to the first embodiment of the present invention and is a view illustrating the drain current characteristic of each temperature by the change rate from the drain current amount at 25° C.

FIG. 9 illustrates the drain current characteristic of each temperature illustrated in FIG. 7 by the change rate from the drain current amount at 25° C. The horizontal axis indicates the control gate voltage Vcg and the vertical axis indicates a drain current change rate ΔIds/Ids@25° C. as a percent. The "Ids@25° C." indicates the drain current amount of the drain-source current Ids at 25° C. A characteristic C-40 indicates the characteristic of the drain current change rate at −40° C., a characteristic C0 indicates the characteristic of the drain current change rate at 0° C., a characteristic C25 indicates the characteristic of the drain current change rate at 25° C., a characteristic C85 indicates the characteristic of the drain current change rate at 85° C., and a characteristic C125 indicates the characteristic of the drain current change rate at 125° C. When assuming the use as a current source, the current change rate to temperatures becomes important. As illustrated in FIG. 9, the current change rate to temperatures becomes zero at the operation point α. On the side where the control gate voltage Vcg is lower than the operation point α, driving is gradually performed in a weak inversion region, and thus the current change rate rapidly increases. Therefore, when a constant current source having small temperature characteristics is realized using the nonvolatile storage element M, driving should not be performed in a region where the control gate voltage Vcg is significantly lower than the operation point α.

Figure 10:
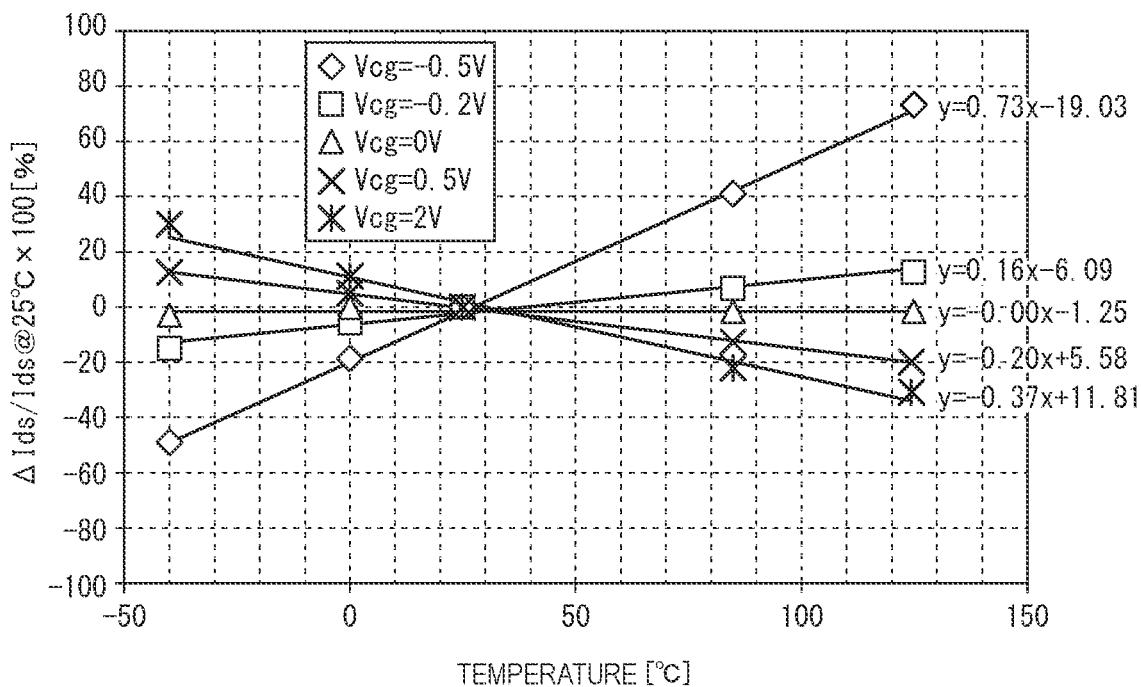
FIG. 10 is a view explaining the nonvolatile storage element M provided in the current source according to the first embodiment of the present invention and is a graph illustrating the drain current change rate at the representative value of the control gate voltage Vcg to temperatures.

FIG. 10 illustrates a graph illustrating the drain current change rate (vertical axis value of FIG. 9) to temperatures at the representative values (−0.5 V, −0.2 V, 0 V, 0.5 V and 2 V) of the control gate voltage Vcg illustrated in FIG. 9. The horizontal axis indicates the temperature and the vertical axis indicates the drain current change rate ΔIds/Ids@25° C. as a percent. A straight line connecting the ◇ marks illustrated in FIG. 10 indicates the characteristic of the drain current change rate at the control gate voltage Vcg of −0.5 V, a straight line connecting the □ marks indicates the characteristic of the drain current change rate at the control gate voltage Vcg of −0.2 V, a straight line connecting the Δ marks indicates the characteristic of the drain current change rate at the control gate voltage Vcg of 0 V, a straight line connecting the x marks indicates the characteristic of the drain current change rate at the control gate voltage Vcg of 0.5 V, and a straight line connecting the * marks indicates the characteristic of the drain current change rate at the control gate voltage Vcg of 2.0 V. Expressions indicated on the right side in FIG. 10 are expressions of the approximate straight lines of the characteristics. "x" in the expressions indicates the temperature of the horizontal axis and "y" indicates the drain current change rate of the vertical axis.

As is understood from FIG. 10, the drain current change rates ΔIds/Ids@25° C. can be regarded to linear-functionally change to temperatures in a region from −40° C. to 125° C. Hereinafter, the inclination when the change in the drain current change rate ΔIds/Ids@25° C. to temperatures is expressed by a linear function is referred to as a temperature coefficient (unit: %/° C.). When each characteristic illustrated in FIG. 10 is taken as an example, the temperature coefficient at the control gate voltage Vcg of −0.5 V is 0.73 (%/° C.), the temperature coefficient at the control gate voltage Vcg of −0.2 V is 0.16 (%/° C.), the temperature coefficient at the control gate voltage Vcg of 0 V is 0.00 (%/° C.), the temperature coefficient at the control gate voltage Vcg of 0.5 V is −0.20 (%/° C.), and the temperature coefficient at the control gate voltage Vcg of 2.0 V is −0.37 (%/° C.).

Figure 11:
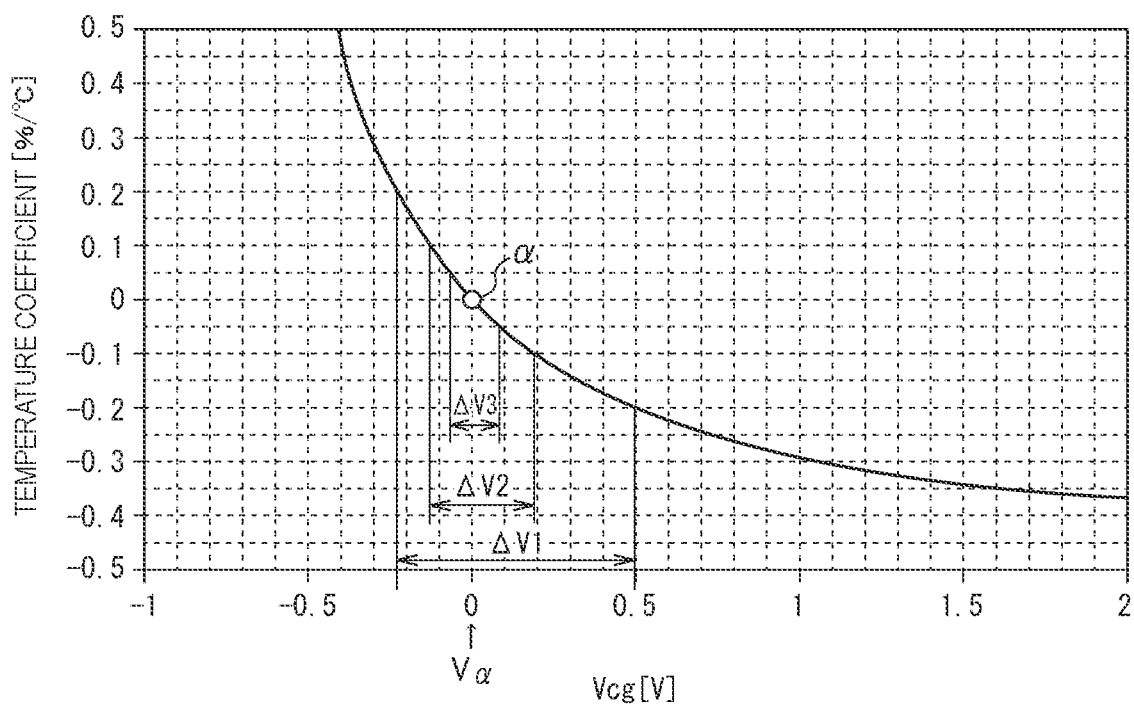
FIG. 11 is a view explaining the nonvolatile storage element M provided in the current source according to the first embodiment of the present invention and is a graph illustrating the temperature coefficient of the drain current in the control gate voltage Vcg.

FIG. 11 is a graph illustrating the temperature coefficient of the drain current at each control gate voltage Vcg. The gate voltage value Vα at the operation point α of the nonvolatile storage element M is 0 V. The drain current value Iα of the drain-source current Ids of the nonvolatile storage element M at the operation point α where the gate voltage value Vα of the control gate voltage Vcg is 0 V is about 33 nA (see FIG. 7) and is less than 100 nA. Herein, even when a bias (i.e., control gate voltage Vcg) applied between the control gate region CG and the source region S of the nonvolatile storage element M is not the gate voltage value Vα at the operation point α, the temperature coefficient (i.e., temperature change rate) of the drain current value of the drain-source current Ids of the nonvolatile storage element M in the range of −40° C. to 125° C. may be less than a predetermined value (within a predetermined range). In the case of a region where the temperature coefficient is over −0.2%/° C. and less than +0.2%/° C., a fluctuation range of the control gate voltage Vcg becomes ΔV1, and thus a fluctuation in the drain-source current Ids also becomes small as illustrated in FIG. 11. The current source provided with the nonvolatile storage element M uses the drain-source current Ids of the nonvolatile storage element M as an output current. Therefore, a bias applied between the control gate region CG and the source region S of the nonvolatile storage element M is set in such a manner that the temperature coefficient of the drain current value of the drain-source current Ids of the nonvolatile storage element M in the range of −40° C. to 125° C. is over −0.2%/° C. and less than +0.2%/° C., whereby a highly accurate current source with sufficiently small temperature characteristics can be realized.

Moreover, the bias may be set in such a manner that the temperature coefficient of the drain current value in the range of −40° C. to 125° C. is over −0.1%/° C. and less than +0.1%/° C. In this case, a fluctuation range of the control gate voltage Vcg is ΔV2 (<ΔV1) and a fluctuation of the drain-source current Ids becomes smaller. Furthermore, the bias may be set in such a manner that the temperature coefficient of the drain current value in the range of −40° C. to 125° C. is over −0.05 and less than +0.05%/° C. In this case, a fluctuation range of the control gate voltage Vcg is ΔV3 (<ΔV2) and a fluctuation of the drain-source current Ids becomes smaller. A super-highly accurate current source can be realized by driving the control gate voltage Vcg of the nonvolatile storage element M in these regions. In the case of current sources having temperature coefficients of 0.2%/° C., 0.1%/° C., and 0.05%/° C., for example, the current change rates in the temperature range of −40° C. to +125° C. are −13% to +20%, −6.5% to +10%, and −3.25% to +5%, respectively, based on 25° C.

Next, a method for adjusting the current amount of the output current in the current source according to this embodiment is described. First, the drain current value $I\alpha$ of the drain-source current Ids when the nonvolatile storage element M is operated at the operation point $\alpha$ is acquired in advance as a design parameter. The nonvolatile storage element M is designed with such a size (gate length, gate width) that the current amount of an output current to be obtained as a current source and the drain current value $I\alpha$ coincide with each other or are values close to each other. As described using FIG. 6, the drain current value $I\alpha$ is hardly affected by manufacturing variations, such as threshold voltage fluctuations. Therefore, a current source outputting the drain-source current Ids of the drain current value $I\alpha$ as an output current becomes a super-highly accurate current source hardly affected by temperatures or manufacturing variations. Hereinafter, a current adjustment method is described using FIG. 12 to FIG. 15 taking a current source driving the nonvolatile storage element M by the control gate voltage Vcg=0 V (short-circuiting the control gate region CG and the source region S) as an example.

Figure 12:
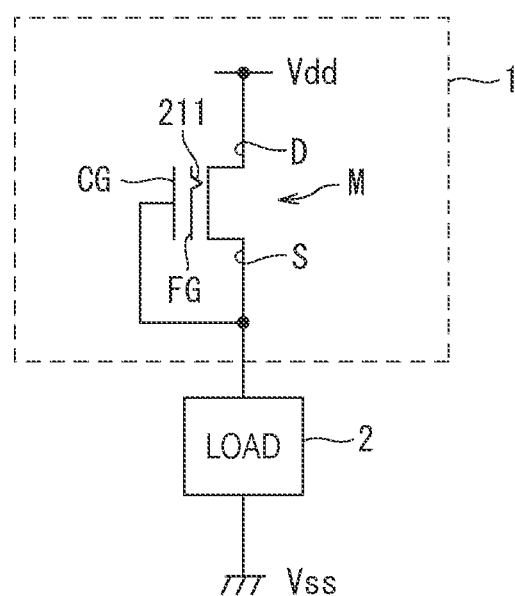
FIG. 12 is a circuit configuration diagram for explaining a current source circuit 1 according to the first embodiment of the present invention.

As illustrated in FIG. 12, a current source circuit (example of the current source) 1 in this embodiment is provided with at least one or more of the nonvolatile storage elements M. The nonvolatile storage element M is disposed between a high voltage supply terminal Vdd to which a high voltage is supplied and a low voltage supply terminal Vss to which a low voltage is supplied. Hereinafter, the reference sign "Vdd" is also used as a reference sign of a high voltage output from the high voltage supply terminal Vdd and the reference sign "Vss" is also used as a reference sign of a low voltage output from the low voltage supply terminal Vss. The drain region D of the nonvolatile storage element M is connected to the high voltage supply terminal Vdd and the source region S is connected to the side of a load 2 as a current supply destination. The source region S and the control gate region CG of the nonvolatile storage element M are connected to each other.

The current source circuit 1 can form a state where a bias is applied between the control gate region CG and the source region S of the nonvolatile storage element M by short-circuiting the control gate region CG and the source region S of the nonvolatile storage element M. Therefore, the bias is 0 V. The current source circuit 1 outputs a current to the load 2 in the state where the bias is applied between the control gate region CG and the source region S of the nonvolatile storage element M.

The load 2 is provided between the source region S and the low voltage supply terminal Vss of the nonvolatile storage element M. More specifically, the nonvolatile storage element M and the load 2 are connected in series between the high voltage supply terminal Vdd and the low voltage supply terminal Vss.

In the current source circuit 1, the nonvolatile storage element M is adjusted to be in a depression state (state where the threshold voltage is negative). The nonvolatile storage element M has the control gate region CG and the floating gate region FG. The nonvolatile storage element M can perform writing and erasing and can hold a writing state over a long period of time.

Figure 13:
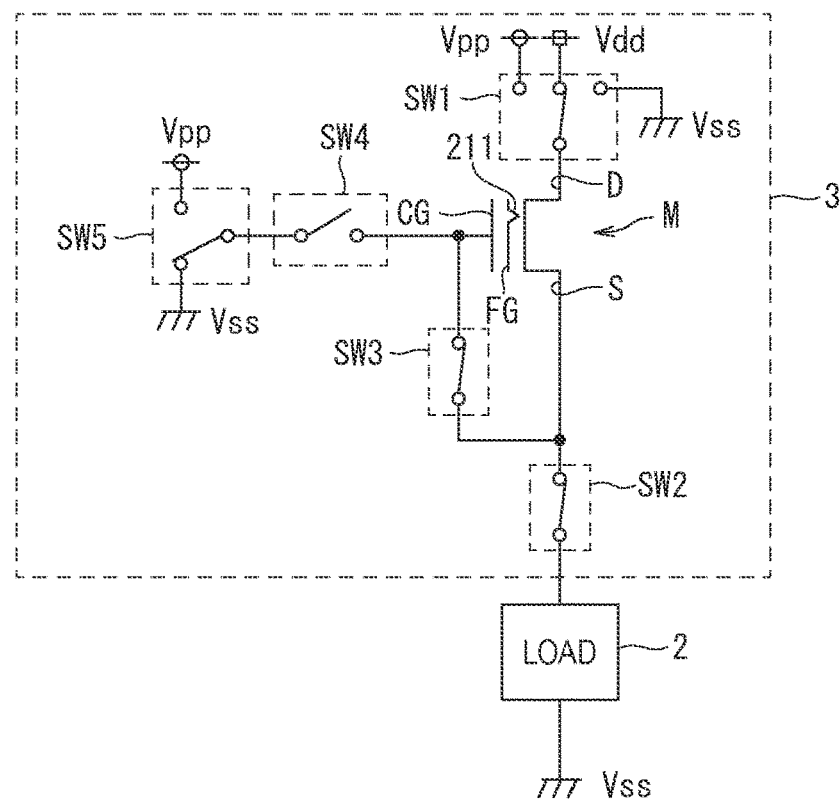
FIG. 13 is a circuit configuration diagram (No. 1) for explaining a current source circuit 3 according to the first embodiment of the present invention.

As illustrated in FIG. 13, the aspect which is a current source circuit (example of the current source) 3 according to this embodiment and in which writing to the nonvolatile storage element M can be performed is provided with a switch SW1, one terminal of which is connected to the drain region D of the nonvolatile storage element M. One of the other terminals of the switch SW1 is connected to the high voltage supply terminal Vdd, another of the other terminals of the switch SW1 is connected to the low voltage supply terminal Vss, and the other of the other terminals of the switch SW1 is connected to an application terminal of the pulse voltage Vpp. By switching the switch SW1 as appropriate, any one of the high voltage Vdd, the low voltage Vss, and the pulse voltage Vpp can be applied to the drain region D of the nonvolatile storage element M.

The current source circuit 3 is provided with a switch SW2 connected in series between the source region S and the load 2 of the nonvolatile storage element M. One terminal of the switch SW2 is connected to the source region S of the nonvolatile storage element M and the other terminal of the switch SW2 is connected to the load 2.

The current source circuit 3 is provided with a switch SW3 connected in series between the control gate region CG of the nonvolatile storage element M and the source region S of the nonvolatile storage element M. One terminal of the switch SW3 is connected to the control gate region CG of the nonvolatile storage element M and the other terminal of the switch SW3 is connected to one terminal of the switch SW2 and the source region S of the nonvolatile storage element M. The current source circuit 3 short-circuits the control gate region CG and the source region S of the nonvolatile storage element M by the switch SW3 and applies a bias. Therefore, the bias is 0 V. Although details are described later, the current source circuit 3 outputs a current to the load 2 in the state where the bias is applied between the control gate region CG and the source region S of the nonvolatile storage element M.

The current source circuit 3 is provided with a switch SW4 having one terminal connected to the control gate region CG of the nonvolatile storage element M and a switch SW5, one terminal of which is connected to the other terminal of the switch SW4. One terminal of the switch SW4 is also connected to one terminal of the switch SW3. One of the other terminals of the switch SW5 is connected to the application terminal of the pulse voltage Vpp and the other one of the other terminals of the switch SW5 is connected to the low voltage supply terminal Vss. The current source circuit 3 can apply either the pulse voltage Vpp or the low voltage Vss to the control gate region CG of the nonvolatile storage element M by switching the switch SW5 as appropriate when the switch SW4 is in a connection state (short-circuit state).

As illustrated in FIG. 13, when the current source circuit 3 supplies a current to the load 2, the switches SW1 to SW5 are switched to the following states.

Switch SW1: High voltage supply terminal Vdd side
Switch SW2: Connection state (short-circuit state)
Switch SW3: Connection state (short-circuit state)
Switch SW4: Open state (open-circuit state)
Switch SW5: Arbitrary (low voltage Vss side in FIG. 13)

In this embodiment, when the switches SW1 to SW5 are switched to the switching states illustrated in FIG. 13 when the nonvolatile storage element M is in a depression state, a highly accurate current is supplied to the load 2 side from the current source circuit 3. More specifically, the current source circuit 3 is provided with a switch portion including the switches SW1 to SW5 setting each terminal of the nonvolatile storage element M to a desired potential.

Figure 14:
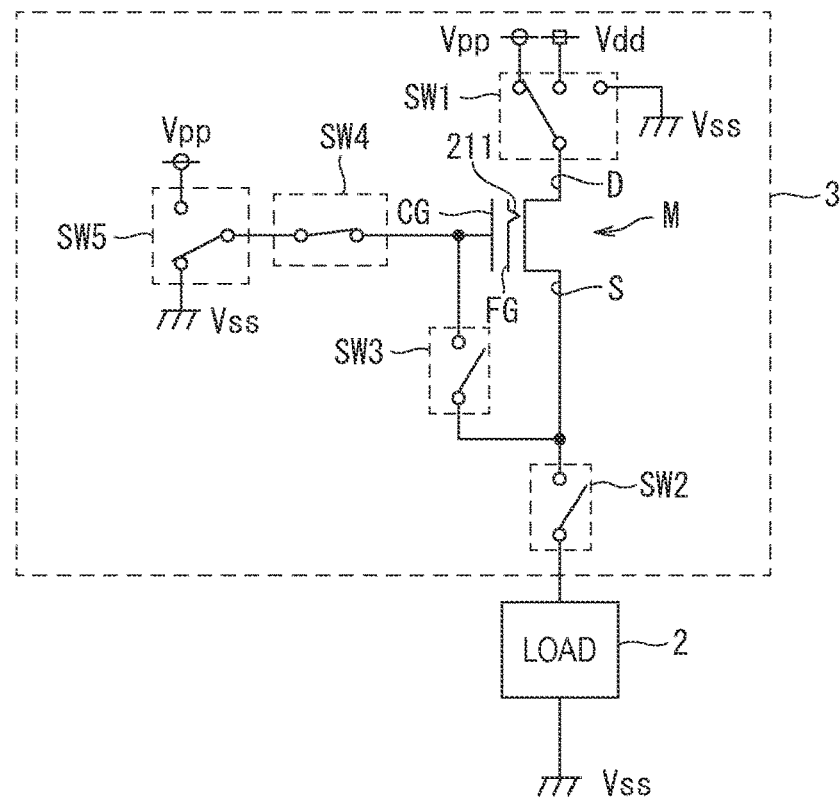
FIG. 14 is a circuit configuration diagram (No. 2) for explaining the current source circuit 3 according to the first embodiment of the present invention.

As illustrated in FIG. 14, the current source circuit 3 switches the switches SW1 to SW5 to the following states when rewriting for setting the nonvolatile storage element M into a depression state. Herein, a case where a threshold voltage before adjustment of the nonvolatile storage element M is higher than a threshold voltage after adjustment is taken as an example.

Switch SW1: Pulse voltage Vpp side
Switch SW2: Open state (open-circuit state)
Switch SW3: Open state (open-circuit state)
Switch SW4: Connection state (short-circuit state)
Switch SW5: Low voltage supply terminal Vss side Therefore, the pulse voltage Vpp is applied to the drain region D of the nonvolatile storage element M and the low voltage Vss is applied to the control gate region CG, and therefore electrons are emitted to the drain region D from the floating gate region FG (charge holding region) through the charge injection port 211. Thus, the threshold voltage of the nonvolatile storage element M becomes low. On the contrary, when the low voltage Vss is applied to the drain region D of the nonvolatile storage element M and the pulse voltage Vpp is applied to the control gate region CG, electrons are injected into the floating gate region FG (charge holding region) from the drain region D through the charge injection port 211. Thus, the threshold voltage of the nonvolatile storage element M becomes high.

Figure 15:
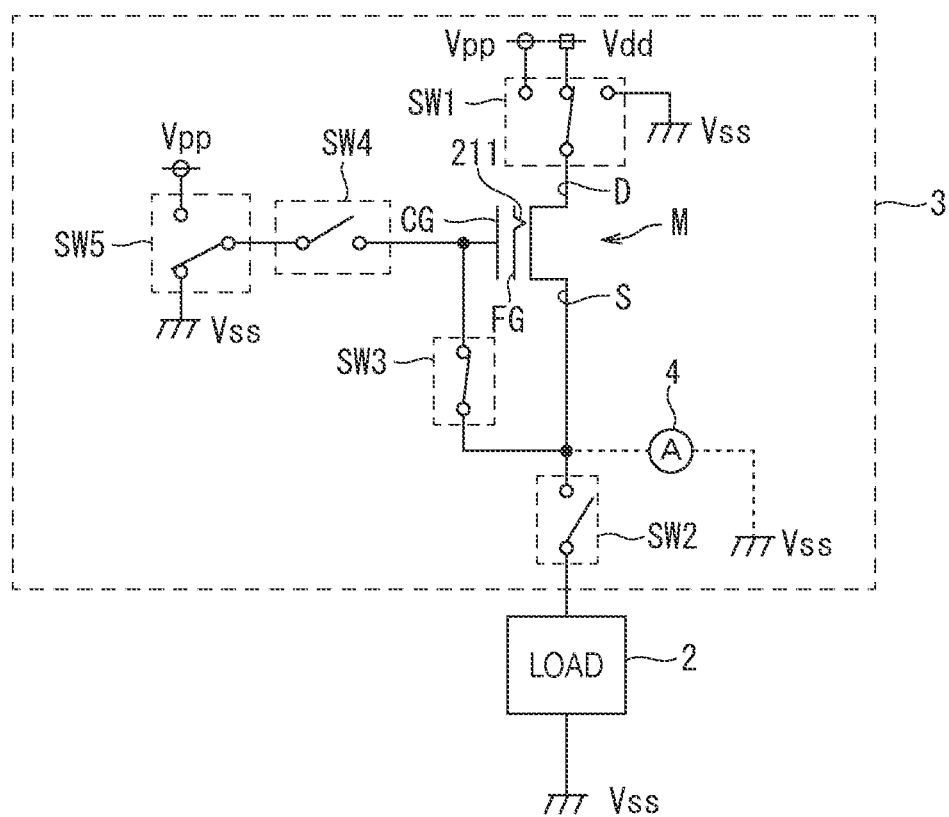
FIG. 15 is a circuit configuration diagram (No. 3) for explaining the current source circuit 3 according to the first embodiment of the present invention.

FIG. 15 is a view illustrating a state of confirming an actual output current (hereinafter also sometimes referred to as "confirmation state") of the current source circuit 3 illustrated in FIG. 13. In the confirmation state, the switches SW1 to SW5 are switched to the following states and an ammeter 4 is connected in series between the source region S and the low voltage supply terminal Vss, and then the output current of the current source circuit 3 is confirmed.

Switch SW1: High voltage supply terminal Vdd side
Switch SW2: Open state (open-circuit state)
Switch SW3: Connection state (short-circuit state)
Switch SW4: Open state (open-circuit state)
Switch SW5: Arbitrary (low voltage Vss side in FIG. 15)

The writing state illustrated in FIG. 14 and the confirmation state illustrated in FIG. 15 are repeatedly performed, and then stopped when a desired output current is obtained. Thus, the adjustment of the output current of the current source circuit 3 is completed. Thereafter, the switches SW1 to SW5 are switched to the states illustrated in FIG. 13, whereby the current source circuit 3 can supply a desired current to the load 2.

As illustrated in FIG. 13 to FIG. 15, the current source circuit 3 rewrites the threshold voltage Vth of the nonvolatile storage element M to such a value that a desired current amount is obtained by appropriately switching the switches SW1 to SW5, and can finally output the drain-source current Ids of the desired current amount as an output current to the load 2 side in a state where the bias is applied between the control gate region CG and the source region S of the nonvolatile storage element M illustrated in FIG. 13.

As described above, according to the current source circuit 1 of this embodiment, an increase in the circuit size can be suppressed and a highly accurate constant current extremely stable to manufacturing variations or temperature fluctuations can be obtained. More specifically, this embodiment can realize a highly accurate constant current source hardly affected by manufacturing variations and not having temperature characteristics.

Moreover, according to the current source circuit 1 of this embodiment, the correction circuit correcting the current value fluctuating to manufacturing variations or temperatures is not required, and thus current consumption in the correction circuit cannot occur, and therefore the chip area can be made small and the consumption current can be reduced.

Moreover, according to the current source circuit 1 of this embodiment, a semiconductor device configuring the current source circuit 1 is produced by the nonvolatile storage element M, whereby an output current having a minute current value can be created.

Second Embodiment

A current source circuit according to a second embodiment of the present invention is described using FIG. 16 to FIG. 20. A nonvolatile storage element in this embodiment has a configuration in which a nonvolatile storage element Mw having the same structure as that of the nonvolatile storage element M illustrated in FIG. 1 and a nonvolatile storage element Mr illustrated in FIG. 16 form one pair, floating gate regions of the nonvolatile storage element Mw and the nonvolatile storage element Mr are connected, and control gate regions of the nonvolatile storage element Mw and the nonvolatile storage element Mr are connected.

Figure 16:
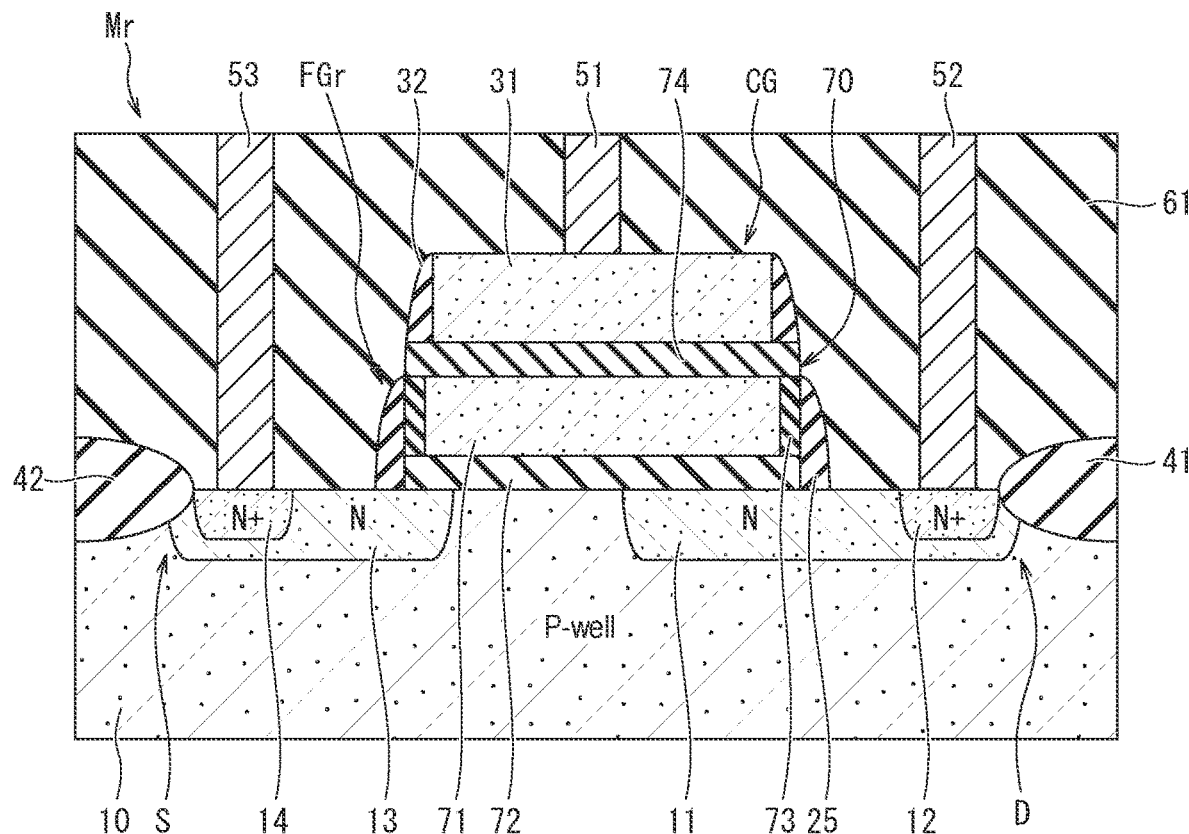
FIG. 16 is a view for explaining a nonvolatile storage element M according to a second embodiment of the present invention and is a cross-sectional view illustrating the schematic configuration of a nonvolatile storage element Mr not having a charge injection port.

As illustrated in FIG. 16, the nonvolatile storage element Mr has the same configuration as that of the nonvolatile storage element Mw except the point of not having a charge injection port. The nonvolatile storage element Mr is provided with a charge holding region 71 and an insulator 70 disposed surrounding the charge holding region 71. The insulator 70 has an upper insulating film 74 formed on the charge holding region 71, a lateral wall oxide film 73 formed on the lateral wall of the charge holding region 71, and a gate insulating film 72 formed under the charge holding region 71. In the gate insulating film 72, a tunnel insulating film is not formed and the film thickness is almost constant. More specifically, a region having different film thickness like the intentionally formed tunnel insulating film 221 as in the gate insulating film 22 in the first embodiment is not formed in the gate insulating film 72. The nonvolatile storage element Mr has the same configuration as that of the nonvolatile storage element M except the point that the configuration of the insulator 70 is different from the configuration of the insulator 20, and therefore the same reference numerals are given to constituent components exhibiting the same actions and functions and a description thereof is omitted.

Figure 17:
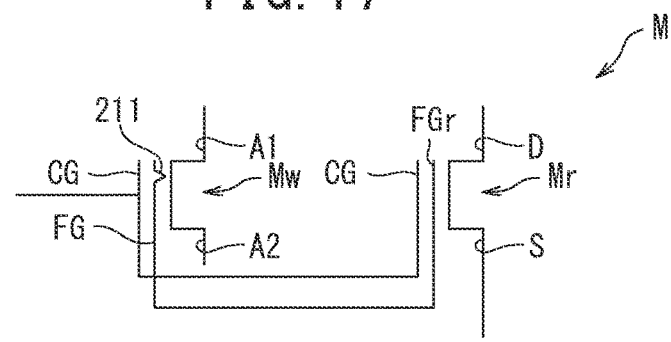
FIG. 17 is a circuit configuration diagram of the nonvolatile storage element M according to the second embodiment of the present invention.

As illustrated in FIG. 17, the nonvolatile storage element M in this embodiment is provided with the nonvolatile storage element Mw having the same structure as that of the nonvolatile storage element M illustrated in FIG. 1 and the nonvolatile storage element Mr illustrated in FIG. 16. A control gate region CG of the nonvolatile storage element Mw and a control gate region CG of the nonvolatile storage element Mr are connected. A floating gate region FG of the nonvolatile storage element Mw and a floating gate region FG of the nonvolatile storage element Mr are connected.

Figure 18:
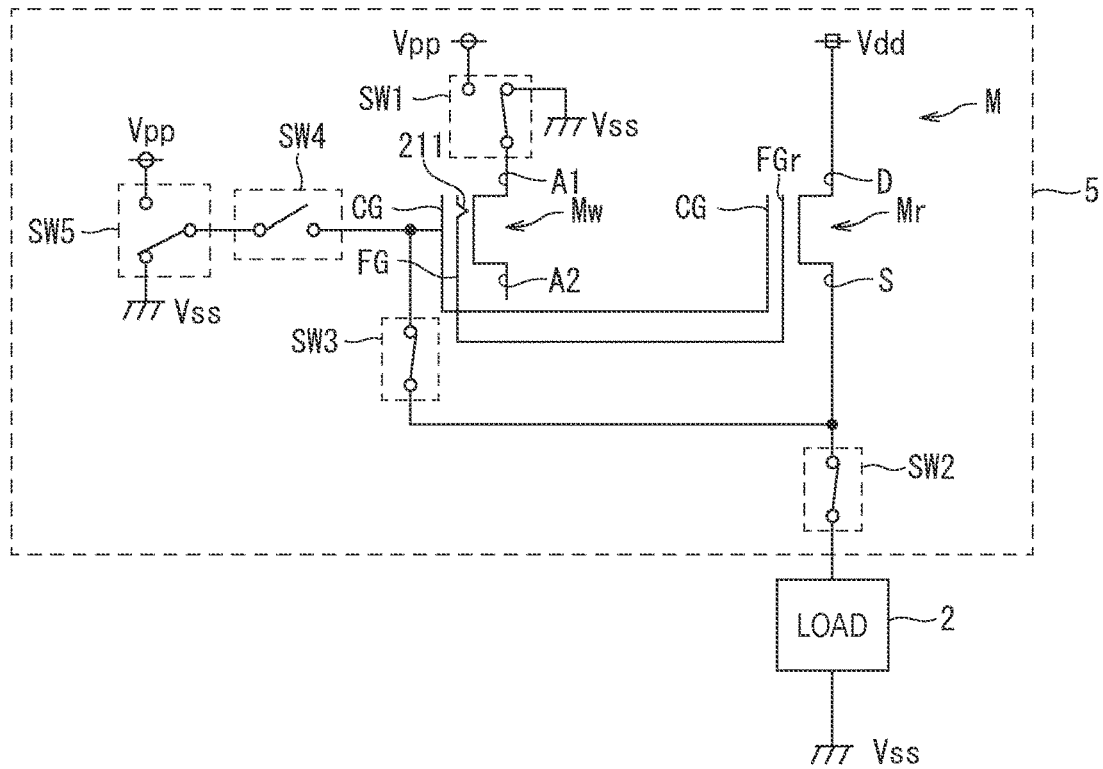
FIG. 18 is a circuit configuration diagram (No. 1) for explaining a current source circuit 5 according to the second embodiment of the present invention.

As illustrated in FIG. 18, a current source circuit (example of the current source) 5 according to this embodiment is provided with at least one or more of the nonvolatile storage elements M. The nonvolatile storage element M has the same configuration as that of the nonvolatile storage element M illustrated in FIG. 17. The nonvolatile storage element M is provided with the nonvolatile storage elements Mw and Mr. The nonvolatile storage element Mw has the same configuration as that of the nonvolatile storage element M illustrated in FIG. 1 and the nonvolatile storage element Mr has the same configuration as that of the nonvolatile storage element Mr illustrated in FIG. 16. Therefore, hereinafter, FIG. 1 is referred to in a description of the configuration of the nonvolatile storage element Mw and FIG. 16 is referred to in a description of the configuration of the nonvolatile storage element Mr, as necessary.

The current source circuit 5 is provided with the nonvolatile storage element (example of a first nonvolatile storage element) Mw and the nonvolatile storage element (example of a second nonvolatile storage element) Mr. The nonvolatile storage element Mr has the control gate region (example of a second control gate region) CG electrically connected to the control gate region (example of a first control gate region) CG provided in a gate region of the nonvolatile storage element Mw. Moreover, the nonvolatile storage element Mr has the charge holding region (example of a second charge holding region, see FIG. 16) 71 electrically connected to the charge holding region (example of a first charge holding region, see FIG. 1) 21 of the nonvolatile storage element Mw and the gate insulating film 72 (see FIG. 16) formed contacting the charge holding region 71. The charge injection port 211 (see FIG. 1) provided in the nonvolatile storage element Mw is formed in a region not contacting a current route formed in the nonvolatile storage element Mr. The charge injection port 211 provided in the nonvolatile storage element Mw is formed in a region not contacting the current path including the drain region D and the source region S of the nonvolatile storage element Mr.

The current route formed in the nonvolatile storage element Mr is a route where the drain-source current Ids of the nonvolatile storage element Mr flows. The drain-source current Ids of the nonvolatile storage element Mr serves as an output current of the current source circuit 5. Therefore, the charge injection port 211 of the nonvolatile storage element Mw is formed in a region not contacting the route of the output current output by the current source circuit 5.

The control gate region CG of the nonvolatile storage element Mw provided in the nonvolatile storage element M and the control gate region CG of the nonvolatile storage element Mr are connected to each other. The floating gate region FG of the nonvolatile storage element Mw and the floating gate region FG of the nonvolatile storage element Mr are connected to each other.

The nonvolatile storage element Mr is disposed between a high voltage supply terminal Vdd to which a high voltage is supplied and a low voltage supply terminal Vss to which a low voltage is supplied. More specifically, a drain region D of the nonvolatile storage element Mr is connected to the high voltage supply terminal Vdd and a source region S is connected to the side of a load 2 which is a current supply destination through a switch SW2 (details are described later). The source region S of the nonvolatile storage element Mr and the control gate region CG are connected to each other.

The nonvolatile storage element Mw has a first region A1 provided on one side of both sides under the floating gate region FG and a second region A2 provided on the other side of both the sides. The current source circuit 5 in this embodiment is provided with a SW1, one terminal of which is connected to the first region A1 of the nonvolatile storage element Mw. One of the other terminals of the switch SW1 is connected to the low voltage supply terminal Vss and the other one of the other terminals of the switch SW1 is connected to an application terminal of the pulse voltage Vpp. The current source circuit 5 can apply either the low voltage Vss or the pulse voltage Vpp to the first region A1 of the nonvolatile storage element Mw by switching the switch SW1 as appropriate.

The current source circuit 5 is provided with the switch SW2 connected in series between the source region S of the nonvolatile storage element Mr and a load 2. One terminal of the switch SW2 is connected to the source region S of the nonvolatile storage element Mr and the other terminal of the switch SW2 is connected to the load 2.

The current source circuit 5 is provided with a switch SW3 connected in series between the control gate region CG of the nonvolatile storage element Mw and the source region S of the nonvolatile storage element Mr. One terminal of the switch SW3 is connected to the control gate region CG of the nonvolatile storage element Mw and the other terminal of the switch SW3 is connected to one terminal of the switch SW2 and the source region S of the nonvolatile storage element Mr.

The control gate region CG of the nonvolatile storage element Mw and the control gate region CG of the nonvolatile storage element Mr are connected. The current source circuit 5 is configured to be able to short-circuit the control gate region CG of the nonvolatile storage element Mw and the source region S of the nonvolatile storage element Mr by the switch SW3. Therefore, the current source circuit 5 can form a state where a bias is applied between the control gate region CG of the nonvolatile storage element Mw and the source region S of the nonvolatile storage element Mr through the control gate region CG of the nonvolatile storage element Mw by short-circuiting the control gate region CG of the nonvolatile storage element Mw and the source region S of the nonvolatile storage element Mr by the switch SW3. The current source circuit 5 short-circuits the control gate region CG and the source region S of the nonvolatile storage element Mr by the switch SW3, and applies a bias. Therefore, the bias is 0 V. Although details are described later, the current source circuit 5 outputs a current to the load 2 in the state where the bias is applied between the control gate region CG and the source region S of the nonvolatile storage element Mr.

The current source circuit 5 is provided with a switch SW4 having one terminal connected to the control gate region CG of the nonvolatile storage element Mw and a switch SW5, one terminal of which is connected to the other terminal of the switch SW4. One terminal of the switch SW4 is also connected to one terminal of the switch SW3. One of the other terminals of the switch SW5 is connected to the application terminal of the pulse voltage Vpp and the other one of the other terminals of the switch SW5 is connected to the low voltage supply terminal Vss. The current source circuit 5 can apply either the pulse voltage Vpp or the low voltage Vss to the control gate region CG of the nonvolatile storage element Mw by switching the switch SW5 as appropriate when the switch SW4 is in a connection state (short-circuit state).

The second region A2 of the nonvolatile storage element Mw is not connected unlike the source region S of the nonvolatile storage element M in the current source circuit 3 and is in a floating state. The nonvolatile storage element Mw is a region present for injecting charges into the floating gate region FG of the nonvolatile storage element Mr and does not flow a current as a transistor. Therefore, the nonvolatile storage element Mw does not need to have the source region S and the drain region D and the form is not limited insofar as the nonvolatile storage element Mw has a structure of having a charge injection port.

As illustrated in FIG. 18, in the current source circuit 5, charges are injected into the floating gate region FG through the nonvolatile storage element Mw when injecting the charges. When operating the current source circuit 5, a current flows through the nonvolatile storage element Mr. In the current source circuit 5, the nonvolatile storage element M (i.e., nonvolatile storage elements Mw, Mr) is in a depression state.

As illustrated in FIG. 18, when the current source circuit 5 supplies a current to the load 2, the switches SW1 to SW5 are switched to the following states.

Switch SW1: Low voltage supply terminal Vss side
Switch SW2: Connection state (short-circuit state)
Switch SW3: Connection state (short-circuit state)
Switch SW4: Open state (open-circuit state)
Switch SW5: Arbitrary (low voltage Vss side in FIG. 18)

In this embodiment, when the switches SW1 to SW5 are switched to the switching states illustrated in FIG. 18 when the nonvolatile storage element M is in a depression state, a highly accurate current is supplied to the load 2 side from the current source circuit 5. More specifically, the current source circuit 5 is provided with a switch portion including the switches SW1 to SW5 setting each terminal of the nonvolatile storage element M to a desired potential.

Figure 19:
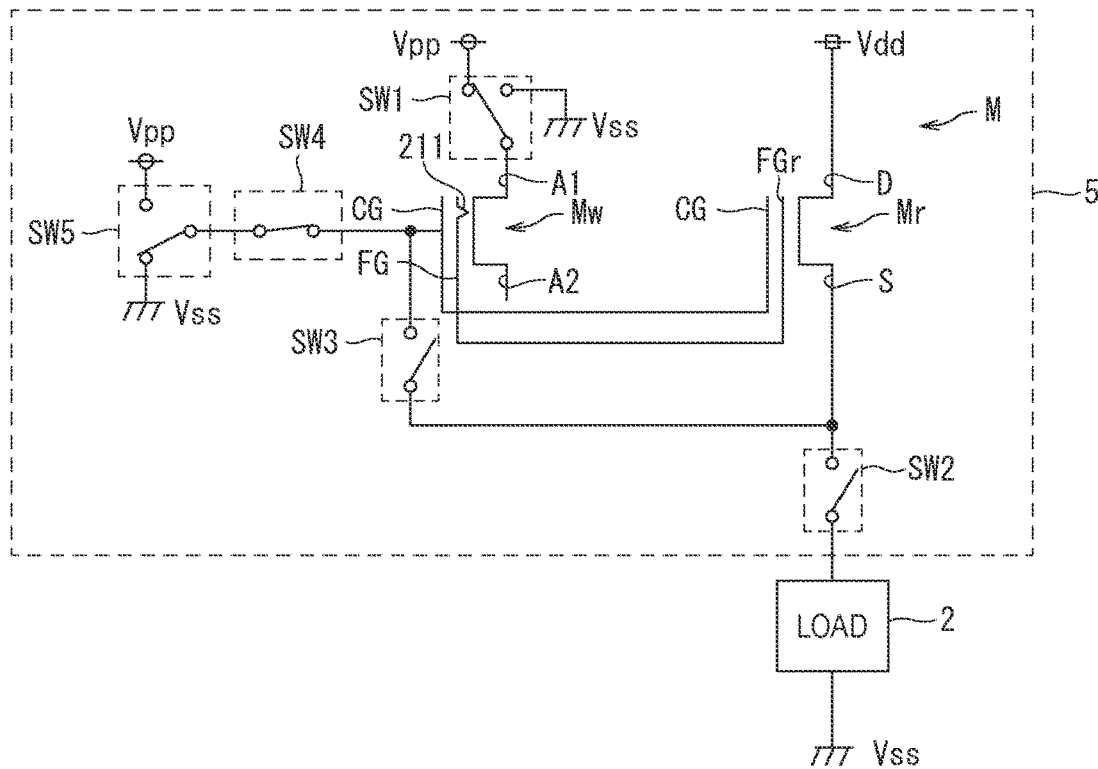
FIG. 19 is a circuit configuration diagram (No. 2) for explaining the current source circuit 5 according to the second embodiment of the present invention.

As illustrated in FIG. 19, the current source circuit 5 switches the switches SW1 to SW5 to the following states when rewriting for changing the nonvolatile storage element M into a depression state. Herein, a case where a threshold voltage before adjustment of the nonvolatile storage element M is higher than a threshold voltage after adjustment is taken as an example.

Switch SW1: Pulse voltage Vpp side
Switch SW2: Open state (open-circuit state)
Switch SW3: Open state (open-circuit state)
Switch SW4: Connection state (short-circuit state)
Switch SW5: Low voltage supply terminal Vss side Therefore, the pulse voltage Vpp is applied to the first region A1 of the nonvolatile storage element Mw and the low voltage Vss is applied to the control gate region CG, and therefore electrons are emitted to the first region A1 from the floating gate region FG (charge holding region) through the charge injection port 211. Thus, the threshold voltage of the nonvolatile storage element Mw becomes low. On the contrary, when the low voltage Vss is applied to the first region A1 of the nonvolatile storage element Mw and the pulse voltage Vpp is applied to the control gate region CG, electrons are injected into the floating gate region FG (charge holding region) from the first region A1 through the charge injection port 211. Thus, the threshold voltage of the nonvolatile storage element Mw becomes high.

Figure 20:
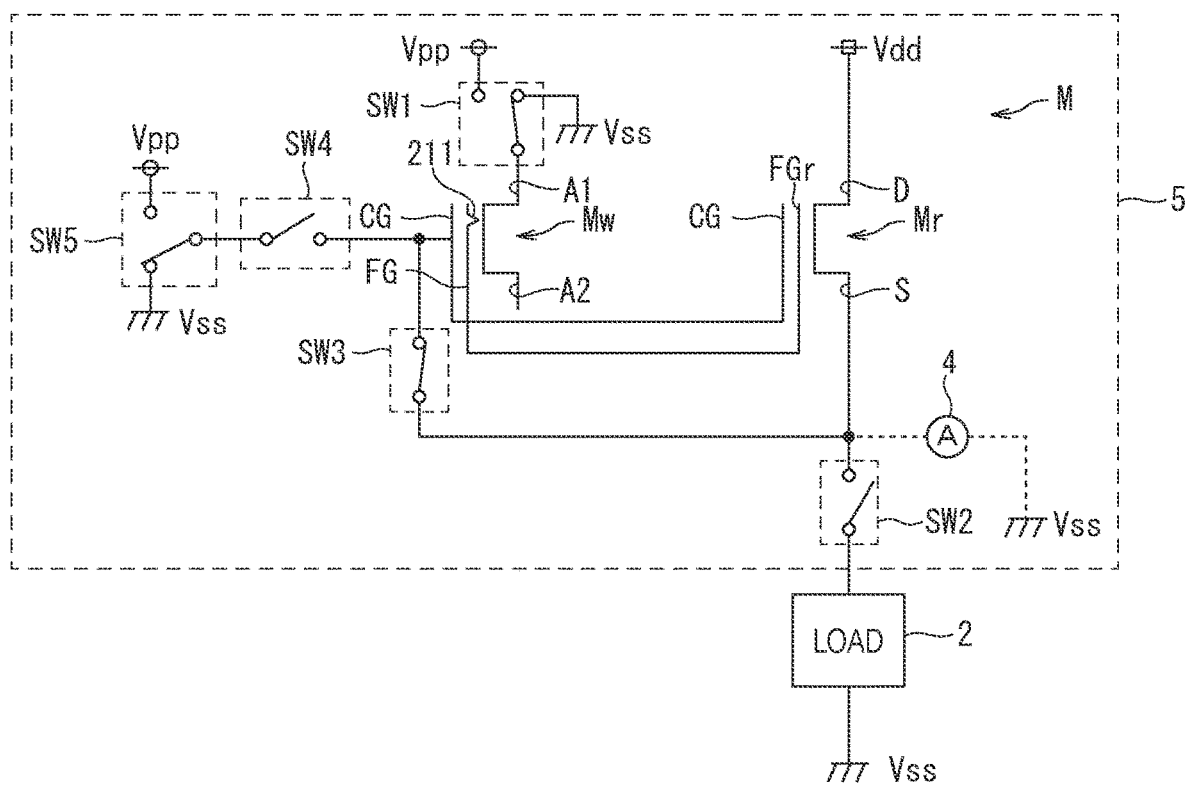
FIG. 20 is a circuit configuration diagram (No. 3) for explaining the current source circuit 5 according to the second embodiment of the present invention.
Figure 21:
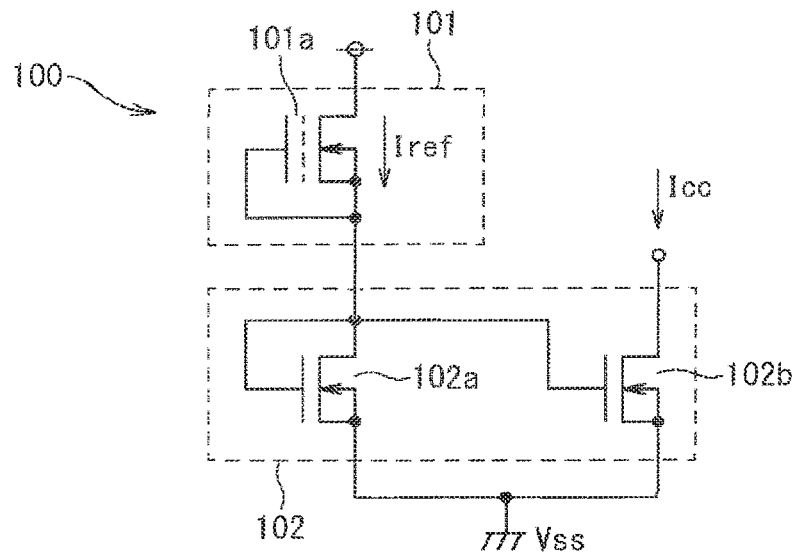
FIG. 21 is a circuit diagram illustrating the configuration of a conventional constant current source generation circuit 100.
Figure 22:
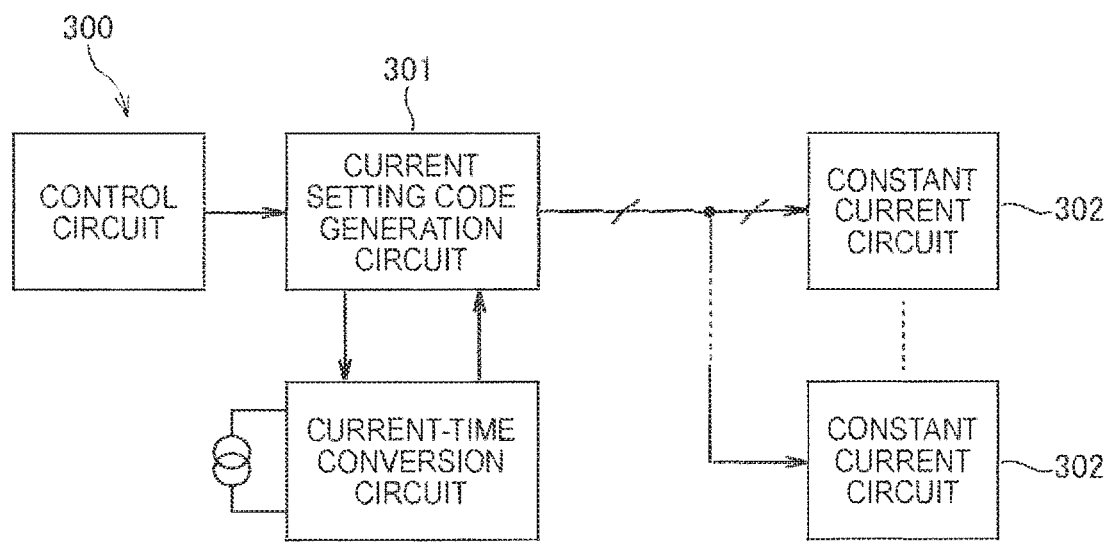
FIG. 22 is a circuit diagram illustrating the configuration of a conventional constant current source 300.

FIG. 20 is a view illustrating a state of confirming an actual output current of the current source circuit 5 illustrated in FIG. 18. In the confirmation state, the switches SW1 to SW5 are switched to the following states and an ammeter 4 is connected in series between the source region S and the low voltage supply terminal Vss, and then the output current of the current source circuit 5 is confirmed.

Switch SW1: Low voltage supply terminal Vss side
Switch SW2: Open state (open-circuit state)
Switch SW3: Connection state (short-circuit state)
Switch SW4: Open state (open-circuit state)
Switch SW5: Arbitrary (low voltage Vss side in FIG. 20)

The writing state illustrated in FIG. 19 and the confirmation state illustrated in FIG. 20 are repeatedly performed, and then stopped when a desired output current is obtained.

Thus, the adjustment of the output current of the current source circuit 5 is completed. Thereafter, the switches SW1 to SW5 are switched to the states illustrated in FIG. 18, whereby the current source circuit 5 can supply a desired current to the load 2.

As illustrated in FIG. 18 to FIG. 20, the current source circuit 5 rewrites the threshold voltage Vth of the nonvolatile storage element Mr to such a value that a desired current amount is obtained by appropriately switching the switches SW1 to SW5, and can finally output the drain-source current Ids of the desired current amount as an output current to the load 2 side in the state where the bias is applied between the control gate region CG and the source region S of the nonvolatile storage element Mr illustrated in FIG. 18.

As described above, according to the current source circuit 5 of this embodiment, an increase in the circuit size can be suppressed and a highly accurate constant current extremely stable to manufacturing variations or temperature fluctuations can be obtained. More specifically, this embodiment can realize a highly accurate constant current source hardly affected by manufacturing variations and not having temperature characteristics.

Moreover, the current source circuit 5 according to this embodiment can adjust the threshold voltage by adjusting the charge amount of the floating gate region FG of the nonvolatile storage element Mw, and therefore the same effects as those of the current source circuit 3 according to the first embodiment are obtained.

Moreover, the current source circuit 5 in this embodiment can separate the current route when injecting charges and emitting charges and the current route when operating of the current source circuit 5 by being provided with the nonvolatile storage element M of the configuration illustrated in FIG. 17. Thus, the current source circuit 5 can prevent unexpected rewriting of the nonvolatile storage element Mw and can achieve an improvement of reliability.

REFERENCE SIGNS LIST 1, 3, 5 current source circuit
2 load
4 ammeter
10 well region
11, 13 N-type region
12, 14 N+ region
20, 70 insulator
21, 71 charge holding region
22, 72 gate insulating film
23, 73 lateral wall oxide film
24, 74 upper insulating film
25, 32 sidewall
41, 42 element isolation region
51, 52, 53 contact plug
61 protective film
211 charge injection port
221 tunnel insulating film
A1 first region
A2 second region
B back gate
CG control gate region
D drain region
FG floating gate region
G gate region
M, Mr, and Mw nonvolatile storage element
S source region

The invention claimed is:

1. A current source comprising: a first nonvolatile storage element having a control gate region, a source region, and a floating gate region and operating as a field effect transistor, wherein in a temperature range of −40° C. to 125° C. and when 0 V is applied between the control gate region and the source region, an amount of charge injected into the floating gate region is such that a temperature coefficient of a current between the current source and a load is over −0.2%/° C. and less than +0.2%/° C., wherein a variation in a threshold voltage associated with the first nonvolatile storage element is compensated by injecting charge into the floating gate region in the amount at which the temperature coefficient of the current between the current source and the load is over −0.2%/° C. and less than +0.2%/° C.

2. The current source according to claim 1, wherein the temperature coefficient of the current is over −0.1%/° C. and less than +0.1%/° C.

3. The current source according to claim 2, wherein a value of the current is less than 100 nA.

4. The current source according to claim 2, wherein the first nonvolatile storage element has the floating gate region consistently connecting to a charge injection unit.

5. The current source according to claim 1, wherein the temperature coefficient is over −0.05%/° C. and less than +0.05%/° C.

6. The current source according to claim 5, wherein a value of the current is less than 100 nA.

7. The current source according to claim 5, wherein the first nonvolatile storage element has the floating gate region consistently connecting to a charge injection unit.

8. The current source according to claim 1, wherein the temperature coefficient is 0%/° C.

9. The current source according to claim 1, wherein a value of the current is less than 100 nA.

10. The current source according to claim 1, wherein the first nonvolatile storage element has the floating gate region consistently connecting to a charge injection unit.

11. The current source according to claim 1, wherein the first nonvolatile storage element has the floating gate region connecting to a charge injection unit, and the charge injection unit comprises a second nonvolatile storage element having a second floating gate region connected to the floating gate region of the first nonvolatile storage element and a charge injection port.

12. The current source according to claim 11, wherein the charge injection port is formed in a region not contacting a route of the current.

13. The current source according to claim 11, wherein the second nonvolatile storage element has a control gate region, and the control gate region of the first nonvolatile storage element directly connects to the control gate region of the second nonvolatile storage element.

14. The current source according to claim 1, wherein the first nonvolatile storage element has the floating gate region connecting to a charge injection unit disposed not on a route of the current.

* * * * *